United States Patent [19]

Blessing et al.

[11] Patent Number: 5,151,865
[45] Date of Patent: Sep. 29, 1992

[54] METHOD AND APPARATUS FOR DETERMINING THE ENERGY CONTENT VALUE OF ELECTROCHEMICAL ENERGY STORES

[75] Inventors: Andreas Blessing, Tennenbronn; Jochen Griss, St. Georgen; Gerd Kammerer, Lossburg, all of Fed. Rep. of Germany

[73] Assignee: Grasslin KG, Fed. Rep. of Germany

[21] Appl. No.: 693,046

[22] Filed: May 1, 1991

Related U.S. Application Data

[63] Continuation of Ser. No. 377,829, Oct. 22, 1988, abandoned.

[30] Foreign Application Priority Data

Oct. 28, 1987 [DE] Fed Rep. of Germany ............ 3736481
Oct. 28, 1988 [DE] Fed Rep. of Germany . PCT/DE88/00647

[51] Int. Cl.$^5$ .................... G06F 15/20; H02J 7/00
[52] U.S. Cl. ................... 364/483; 364/481; 364/550; 320/48; 324/427
[58] Field of Search ................... 364/480–483, 364/550, 707; 320/5, 31, 39, 40, 43, 48; 340/636; 324/424, 427, 429–431

[56] References Cited

U.S. PATENT DOCUMENTS

| 4,180,770 | 12/1979 | Eby | 324/429 |
|---|---|---|---|
| 4,204,162 | 5/1980 | Froidevaux | 324/430 |
| 4,388,618 | 6/1983 | Finger | 320/48 |
| 4,455,523 | 6/1984 | Koenck | 320/43 |
| 4,484,130 | 11/1984 | Lowndes et al. | 320/40 |
| 4,553,081 | 11/1985 | Koenck | 320/48 |
| 4,558,281 | 12/1985 | Codd et al. | 324/427 |
| 4,633,418 | 12/1986 | Bishop | 320/48 |
| 4,678,998 | 7/1987 | Muramatsu | 324/430 |
| 4,709,202 | 11/1987 | Koenck et al. | 320/48 |
| 4,737,702 | 4/1988 | Koenck | 320/40 |
| 4,958,127 | 9/1990 | Williams et al. | 320/48 |

FOREIGN PATENT DOCUMENTS

| 0090699 | 3/1983 | European Pat. Off. . |
|---|---|---|
| 2926716 | 1/1981 | Fed. Rep. of Germany . |
| 2952853 | 5/1981 | Fed. Rep. of Germany . |
| 3031898 | 1/1982 | Fed. Rep. of Germany . |
| 3116371 | 2/1983 | Fed. Rep. of Germany . |
| 3216412 | 11/1983 | Fed. Rep. of Germany . |
| 3416849 | 11/1984 | Fed. Rep. of Germany . |
| 3407409 | 9/1985 | Fed. Rep. of Germany . |
| WO/86/004-18 | 1/1986 | PCT Int'l Appl. . |

Primary Examiner—Kevin J. Teska
Attorney, Agent, or Firm—Hill, Van Santen, Steadman & Simpson

[57] ABSTRACT

The method for determining the energy content value (EIW) of electrochemical energy stores (1) by measuring the terminal voltage ($U_{KL}$) of an energy store (1) recognizes at least one reference value (BW) that is formed from a sum current (EI) flowing in the energy store (1) in a specific time unit (dt) and in a specific operating voltage range (BSB) and/or from reaction values of the energy store (1) such as the internal resistance, the inside temperature and the acid density; dependent on a defined terminal voltage ($U_{KL}$) in the operating voltage range (BSB) and on a defined energy content value (EIW) in an energy content range (EIB), this reference value (BW) thereby represents a function value. The measured terminal voltage ($U_{KL}$) referred to the function value (FW) corresponds to a specific energy content value (EIW) in the energy content range (EIB).

7 Claims, 5 Drawing Sheets

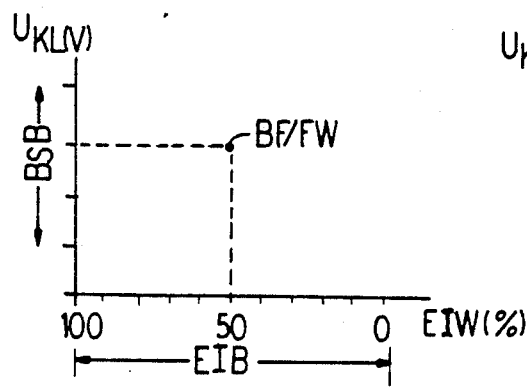
FIG. 1
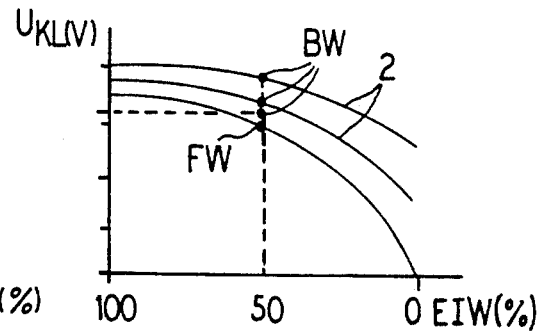
FIG. 2
FIG. 3
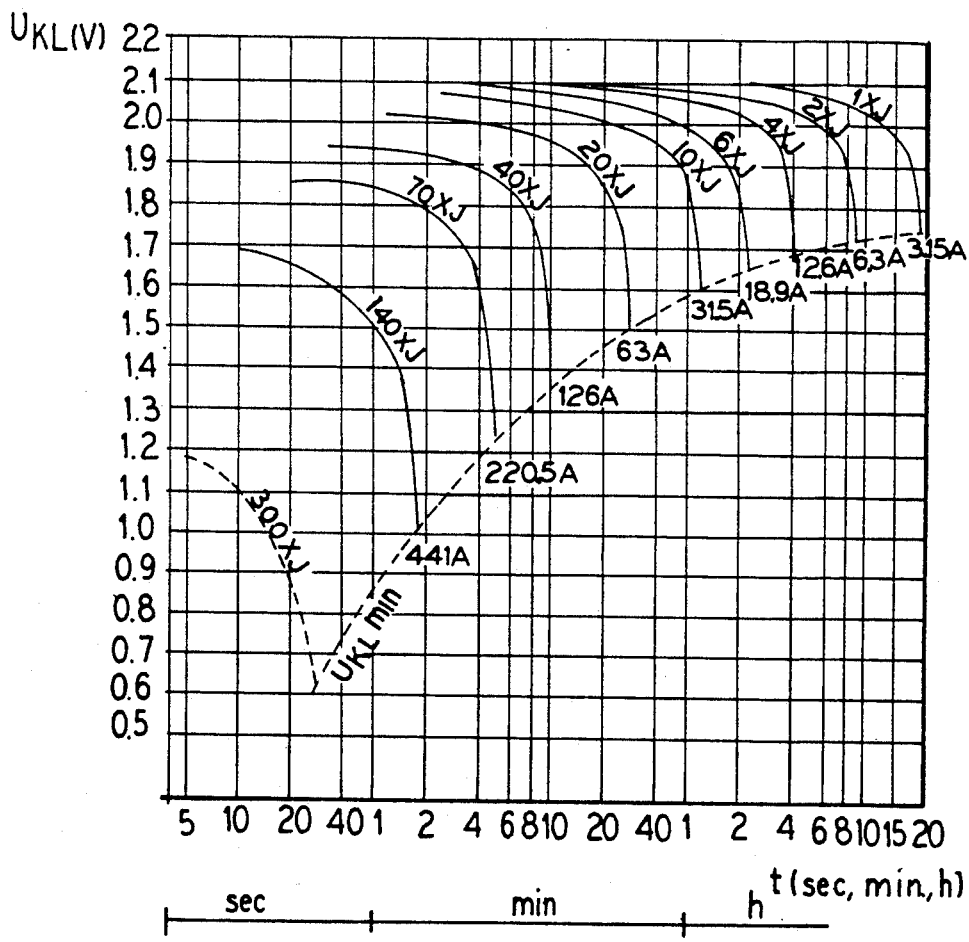

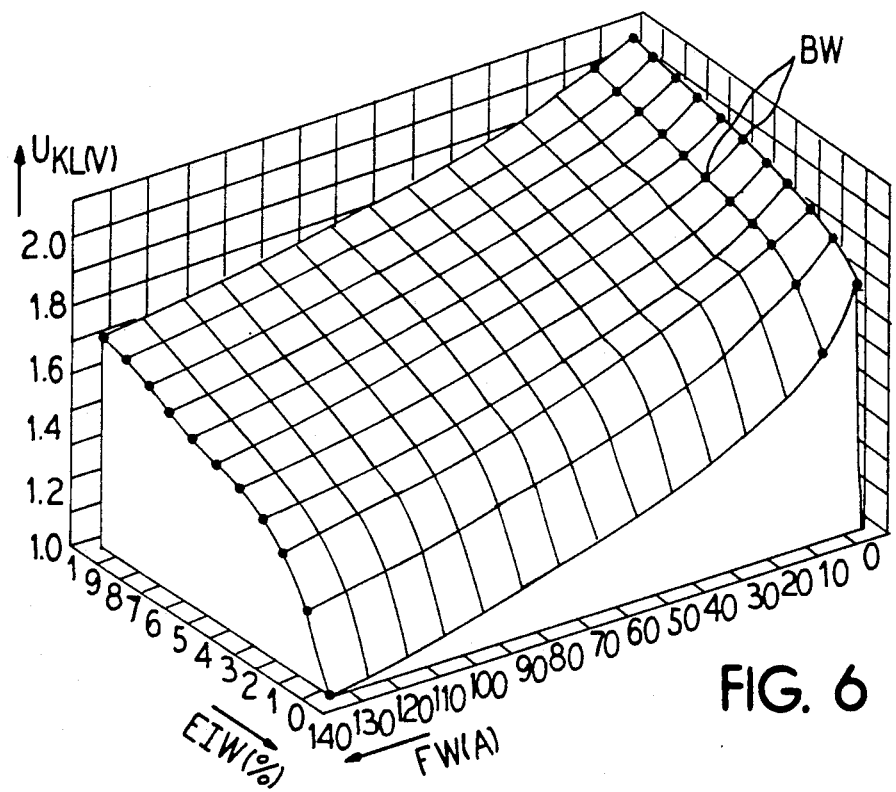
FIG. 6
FIG. 7
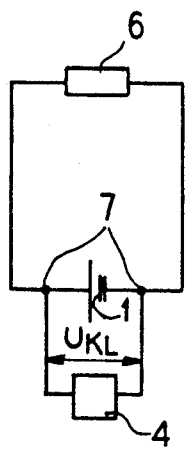
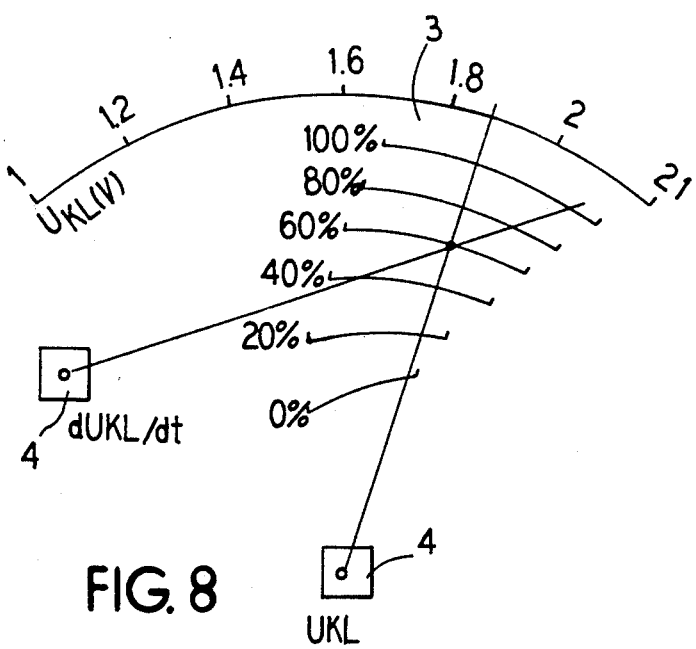
FIG. 8

METHOD AND APPARATUS FOR DETERMINING THE ENERGY CONTENT VALUE OF ELECTROCHEMICAL ENERGY STORES

This is a continuation of application Ser. No. 377,829, filed Oct. 22, 1099, now abandoned.

BACKGROUND OF THE INVENTION

The invention is directed to a method for determining the energy content value of electrochemical energy stores in charging and/or discharging mode by measuring the terminal voltage of an energy store. The invention is further directed to an apparatus for the implementation of the method.

Such energy stores, both as individual cells as well as cells arbitrarily interconnected to form a battery, serve in many fashions as traction and starter batteries for land craft, aircraft and water craft, as well as serving for the energy supply of a multitude of portable and stationary systems, of machine controls and device controls, of measuring equipment, signal systems and alarm systems and for solar-electrically operated stores. In many of the said applications, an especially continuous, adequately precise determination and monitoring of the energy content of such energy stores is required in order to avoid an interruption of the operation of the devices operated by an energy store, for the capacity of an energy store can only be fully exploited and an upward transgression or downward transgression of defined charging or discharging limits that is injurious to an energy store can only be avoided given an exact knowledge of the respective energy content. It should thereby be assured that the method can be implemented with simple means and that the apparatus for determining the energy content value can be operated in a surveyable and practical manner.

WO 86/00418 has disclosed a method for monitoring the charging status of chargeable batteries, particularly nickel-cadmium accumulators, whereby a reference value corresponding to a defined charging status is stored, the terminal voltage, the intensity of the current and the time during every charging and discharging cycle of the battery are measured and, taking the polarity of the current into consideration, are converted into a quantity corresponding to the supplied or, respectively, consumed amount of energy from which the actual values of the charging status are calculated proceeding from a reference value, whereby the rate of change of the terminal voltage in the charging and discharging cycle is monitored, whereby at least one point in time where at a characteristic, more pronounced rate of voltage change occurs is determined after traversing a phase of relatively uniform and low rate of voltage change, and whereby the actual value of the charging status that is calculated at this point in time or at a point in time delayed in defined fashion is balanced to the prescribed reference value.

For the implementation of this method, a means is provided therein comprising arrangements for measuring the terminal voltage of the battery, the direction and amplitude of the charging or, respectively, discharging current and the battery temperature, a program-controlled arithmetic unit that is connected to the measuring arrangements and controlled such that it monitors the rate of change of the terminal voltage during all charging and discharging cycles of the battery and determines an actual value of the charging status when, following an essentially constant phase, the rate of voltage change experiences a more pronounced change, a memory that is connected to the arithmetic unit for storing the reference values and the actual values developed in the arithmetic unit for the supplied or, respectively, used amounts of energy, and an interface and driver circuit for coupling the arithmetic unit to peripheral input and output devices.

This method is affected by the considerable disadvantage that, among other things, a measurement of the charging current or, respectively, discharging current is required therein for calculating the charge status and that a precision resistor must be connected into the circuit of the battery for this purpose, the required reference value in this respect being calculated at this precision resistor. Further, the considerable metrological outlay required is disadvantageous, this making an economical employment thereof seem meaningful only in appropriate large-scale systems.

A method disclosed by German Published Application 34 16 849 comprising an arrangement for measuring the charge status of batteries also uses an initialized ampere-hour meter for the proximation of the charge status of the battery system to be measured, this proceeding on the basis of a completely charged battery, whereby the output signal of the meter follows the true charge status of the battery system closely enough.

This method is likewise affected by the disadvantage of an operation performed on the circuit of the battery system, particularly since the current determined therein at a measuring shunt adequately allows a calculation together with other reaction values only given an adequately constant loading of the battery.

In the method disclosed by German Published Application 29 52 835, moreover, an acquisition of the current flux through the accumulator is required for the determination of the capacity of an accumulator, so that an operation performed on the circuit is also required here, this being affected by the disadvantages already set forth.

SUMMARY OF THE INVENTION

The object of the invention is to create a method and an apparatus for the implementation of the method for determining the energy content value or efficiency in percentages or in a performance unit or in a distance or in a time unit or a work clock or such a unit that is to be implemented only with a measurement of the terminal voltage of an energy store and given knowledge of the discharge characteristic of the energy store to be measured. It should thereby be assured that the apparatus for the determination of the energy content value is simple and economical in structure and is practical.

This object of the invention is achieved in accord with the characterizing part of patent claim 1 and the subclaims not only claim further, critical features of the method but also identify various apparatus for the implementation of the method.

What is advantageous in this method and given the apparatus for the determination of the energy content value of an energy store that are claimed for the implementation of this method is not only that no electrical operation performed on the load circuit of the energy store is required not only that the precision of the identified energy content value is independent of the loading of the energy store, not only that the age and the ambient temperature of the energy store, among other things, are also expressed in the value of the measured terminal voltage and are taken fully into consideration in the identified energy content value, not only that the energy content value still available and/or the remaining discharge time can be indicated in predicting fashion, particularly given the assumption that the average load on the energy store will not significantly change after the beginning of the discharge, but also that the essentially simple apparatus-oriented outlay can be composed of only a voltage-measuring instrument in the most economical case and with adequate precision, this voltage-measuring instrument being equipped with a special scale whose division of measuring range is determined by the reference value or, respectively, by the corresponding function value.

The simple acquisition of the reference value or, respectively, of the function value corresponding thereto, particularly from the static characteristics, particularly the discharge characteristics, in the nominal condition of an energy store is also advantageous, whereby these characteristics are stored in a computer together with the sum currents or discharge currents belonging to these characteristics, a defined function value being calculated by interpolation therefrom and the measured terminal voltage being referred thereto in the determination of the energy content value. A specifically developed computer program upon utilization of Neville's algorithm is advantageous in this case for the determination of the function value from the individual reference values on the stored characteristics in the form of static discharge characteristics that can be derived from the data of the manufacturer of the energy store that are typical for an energy store to be measured.

It is also advantageous that the reference value or, respectively, a function value corresponding thereto can be calculated from a momentarily flowing sum current of the energy store. Upon employment of a Hall measuring probe, this sum current can thereby be measured immediately before the determination of the energy content value from which the required function value is calculated via the reference value, being measured without the utilization of a precision resistor for the sum current in the load circuit of an energy store.

BRIEF DESCRIPTION OF THE DRAWINGS

The manner in which the method and the implementation thereof with appropriate apparatus has been conceived in detail is shown in the drawings and shall be set forth in greater detail below with reference to some function examples and some examples of apparatus for the determination of the energy content value. Shown are:

FIG. 1 the illustration of a function diagram with a function value corresponding to a specific, individual reference value;

FIG. 2 an illustration of a function diagram having a plurality of sum current/discharge current characteristics with individual reference values and a function value interpolated therefrom;

FIG. 3 an illustration of a function diagram with a family of static sum current/discharge current characteristics that correspond to the technical data of an energy store, these technical data being supplied by the manufacture of an energy store;

FIG. 6 an illustration of a spatial function diagram with the terminal voltage $U_{KL}$ as function of the energy content value EIW in percent for various reference values BW and corresponding function values FW;

FIG. 7 a block circuit diagram of a simplest load circuit supplied by an energy store;

FIG. 8 a schematic illustration of an apparatus for the determination of the energy content value EIW comprising two voltage-measuring instruments;

DESCRIPTION OF THE PREFERRED EMBODIMENT

Figure 4:
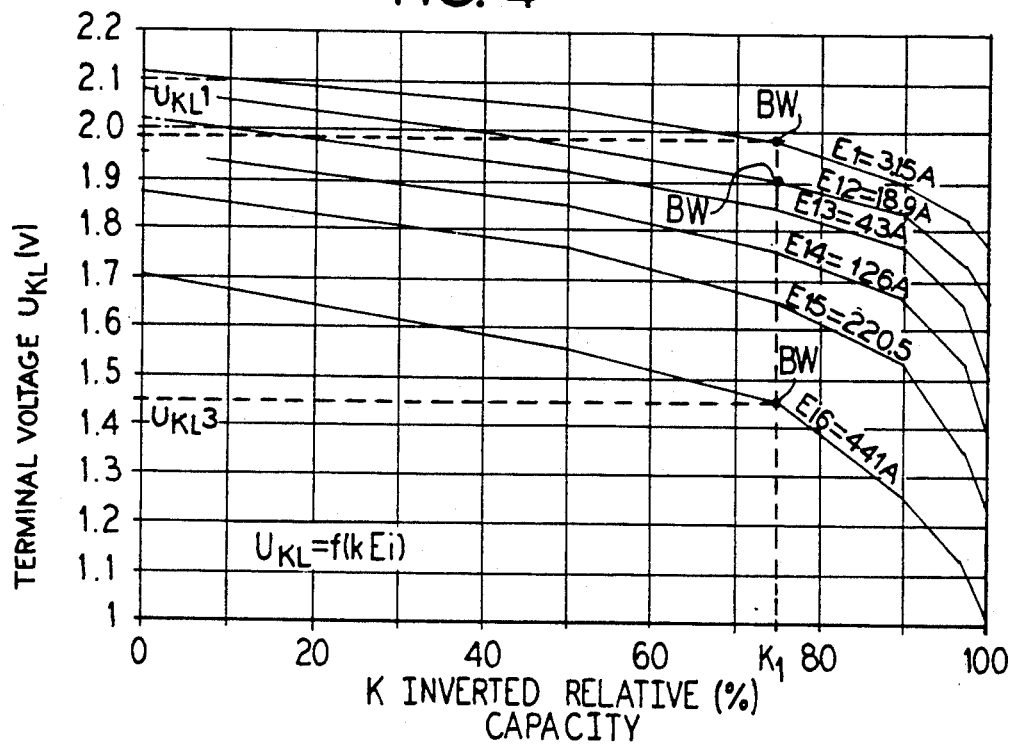
FIG. 4 an illustration of a function diagram with the terminal voltage $U_{KL}$ as a function of the relative energy content value EIW in percent for various sum/discharge currents EI.

The function diagram shown in FIG. 1 with the terminal voltage $U_{KL}$ as function of the energy content value EIW, in percent, shows a single, specific reference value BW that is formed from an assumed, calculated or measured sum current EI flowing in a defined time unit dt and in a defined operating voltage range BSB and/or from reaction values of the energy store such as the internal resistance, the internal temperature or the acid density and that corresponds to the function value FW in terms of this function, the measured terminal voltage $U_{KL}$ referring to this function value FW in the determination of the energy content value EIW of the method of the invention.

The sum current EI therein can be the sum of one or more discharge currents to be taken into consideration and/or of a charging current insofar as a rechargeable energy store is involved.

However, it is also provided that the present method is also utilized in non-rechargeable energy stores.

Both rechargeable as well as non-rechargeable individual cells or cells arbitrarily interconnected to form a battery are thus to be understood by the term energy store.

As already mentioned, the energy content value EIW in the energy content range EIB can be a percentage-referred value. However, it has also been envisioned to determine the energy content value EIW as a capacity value or as distance or as a work clock or as a time-referred value when this is expedient for the purpose and, proceeding beyond the momentary energy content of an energy store, a use-related power statement and-/or a control effect or, respectively, a signal effect are to be achieved from this value.

In accord with the method, thus, it is possible that a specific energy content value EIW for the energy store being measured is identified at a defined, measured value of the terminal voltage $U_{KL}$ of an energy store with a corresponding apparatus as shown and set forth in greater detail below and in which a specific, individual reference value BW is calculated that essentially corresponds to the function value FW in the diagram of FIG. 1. The discharging or the charging of the energy store can thus be monitored in versatile fashion with such an apparatus that utilizes the present method in its simplest form.

The method is thereby not limited to the employment of only a single reference value BW; on the contrary, it is provided that a plurality of reference values BW having sum currents EI differing from one another be involved, whereby a common function value FW to which the function $U_{KL} = f(EIW, EI)$ can be applied is calculated from these various reference values BW.

The calculated energy content value EIW therein can express how much electrical energy, for example in percent, has already been used in the energy store or how much energy is still present. The identification of the energy content value EIW thereby always begins with a 100% remaining energy content value EIW referred to a specific operating voltage range BSB of the energy store.

According to a further, advantageous possibility of the method, the static discharge characteristics 2 are utilized as reference values in order to determine the energy content value EIW of an energy store during discharging and/or charging only by measuring the terminal voltage $U_{KL}$ of the energy store. In these static discharge characteristics 2 as published by the manufacturers of energy stores in the technical data in the form of a characteristics data sheet, the terminal voltage $U_{KL}$ is selected as a function of the discharge time in seconds, minutes, hours for different discharge currents, as may be seen from FIG. 3. These discharge characteristics 2 represent the nominal condition of an energy store.

For the calculation of the energy content value EIW, a form is in turn selected therein wherein the terminal voltage $U_{KL}$ for various sum currents EI is a function of the relative capacity K, in percent, corresponding to $U_{KL} = f(k, EI)$. As FIG. 4 shows, the x-axis is inverted in this function (100% $-k$).

Figure 5:
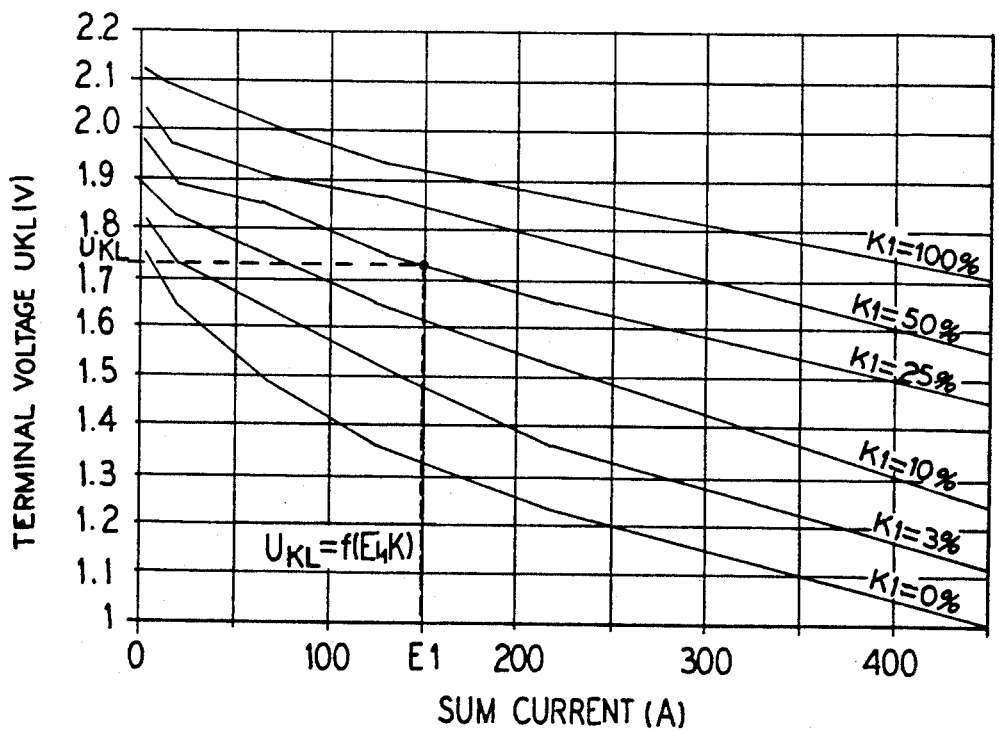
FIG. 5 an illustration of a function diagram with the terminal voltage $U_{KL}$ as function of the sum current-/discharge current EI for different, relative energy content values EIW in percent.

Yet another representation can be derived from FIG. 3 in that the terminal voltage $U_{KL}$ is entered over the sum current EI for a few, relative capacities (k), $U_{KL} = f(EI, k)$, as shown in FIG. 5. This relationship is required in order to be able to calculate the sum current EI from the measured voltage.

In the calculation of the energy content value EIW, it is necessary that the various operating conditions of an energy store such as the charge status or degree of charging at the beginning of discharge, the age and the electrolyte temperature be taken into consideration.

The calculation beings with 100% remaining capacity. Dependent on the charge status of an energy store at the beginning of discharging, 100% remaining capacity can denote various capacities or, respectively, energy content values EIW. This remaining capacity or, respectively, the remaining energy content value EIW in percent and the measured terminal voltage $U_{KL}$ determine a reference value BW in the characteristics field that corresponds to an assumed sum or discharge current. In nearly all cases, this current does not coincide with the measurable, real sum or discharge current. These two comparison current coincide only when the energy store is situated precisely in the characteristic or nominal condition. The assumed sum or discharge current is calculated by interpolation with the supporting points from the characteristics field of FIG. 4 corresponding to the momentary remaining energy content value EIW or the remaining capacity and with the current terminal voltage $U_{KL}$, as the following example shows:

Let the momentary, relative remaining energy content value EIW or the relative remaining capacity be k $=25\%$; as a result of inversion, $k_I = 100\% - 25\% = 75\%$ derives therefrom. This value yields intersections with the three characteristics $U_{KL}1 = 1.98V$; $EI_1 = 3.15A$
$U_{KL}2 = 1.90V$; $EI_2 = 18.9A$
$U_{KL}3 = 1.45V$; $EI_3 = 441A$ These points of intersection equal to reference values BW are supporting points of a characteristic 2 in FIG. 4.

Because of the six (6) cells of the energy store 1, a terminal voltage $U_{KL}$ per cell of $U_z = U_{KL}/6 = 1.717V$ follows with the currently measured terminal voltage $U_{KL}$ of, for example, $U_{KL} = 10.3V$. The assumed sum current EI is interpolated with this argument, so that a value of $EI = 150A$ is obtained.

The absolute capacity used during the duration T of the measuring interval is calculated with this calculated sum current EI, so that $K_v = EI \times T = 150A \times 10$ seconds $= 0.417Ah$ applies.

The maximum energy content value EIW available or the maximum capacity in the energy store 1 is dependent on the load. The nominal capacity can only be taken given loading with the nominal current. The obtainable degree of discharge that is equal to one (1) at nominal load drops to values down to 0.2 given high discharge currents This is to be attributed to a blocking effect as a consequence of the excessively low diffusion rate of the electrolyte. The concentrated electrolyte between the plates of the energy store can not re-diffuse quickly enough into the pores of the plates. An acid depletion in the pores of the plates occurs. The electrolyte resistance thus increases greatly, the voltage at the terminals collapses and a premature end of discharging occurs.

The program for calculating the energy content value EIW is thus aware of the maximum capacity values for different discharge currents, for instance the nine (9) data sheet characteristics as may seen from FIG. 3. The discharge current of characteristic 2 therein multiplied by the maximally obtainable discharge time yields the maximum capacity $K_{max}$. A further characteristic is interpolated with these supporting points and, in particular, upon utilization of Neville's algorithm and the maximum capacity belonging to the assumed sum current or discharge current of 150A is calculated at $K_{max} = 22AH$.

The ration of $k_v$ to $K_{max}$ yields the relative capacity used during the duration of the measuring interval, this yielding a new remaining capacity when subtracted from the most recently calculated, relative remaining capacity. According, $k = 25\% - (0.417/22) \times 100\% = 23.1\%$ applies. This calculation is repeated until a select, lower limit, for example 20% remaining capacity, is downwardly transgressed.

Dependent on the operating condition and on the load of the energy store 1, the proper point in time at which no further charge dare be removed in order to avoid over-discharging is calculated according to the present method. The influencing variables such as the aging, the electrolyte temperature and the degree of charging are expressed in the size of the terminal voltage $U_{KL}$ and are thus also expressed in the calculated function value FW.

Two cases that differ from one another shall be shown for illustrating this fact:

1. When the energy store 1 is new and/or fully charged and/or the electrolyte temperature is higher than the nominal temperature, then, due to the higher terminal voltage $U_{KL}$ measured there, a smaller function value than would be the case in the nominal condition is calculated.

2. When the energy store 1 is no longer new and/or not fully charged and/or the electrolyte temperature is lower than the nominal temperature, then a higher function value is calculated as a consequence of the lower terminal voltage $U_{KL}$ measured therein.

Discharging can be carried out longer in case 1 than under the conditions of the nominal condition or those of case 2.

A spatial function diagram may be seen from FIG. 6; any arbitrary function value FW can lie on the surface illustrated there. BW references the reference values, EIW references the axis for the energy content value in percent, $U_{KL}$ references the function axis for the terminal voltage.

FIG. 7 shows a simple circuit comprising an energy store 1 and a user 6. 4 references an instrument for direct calculation of the energy content value by measuring the terminal voltage $U_{KL}$ at the terminals 7 of the energy store 1.

Figure 9:
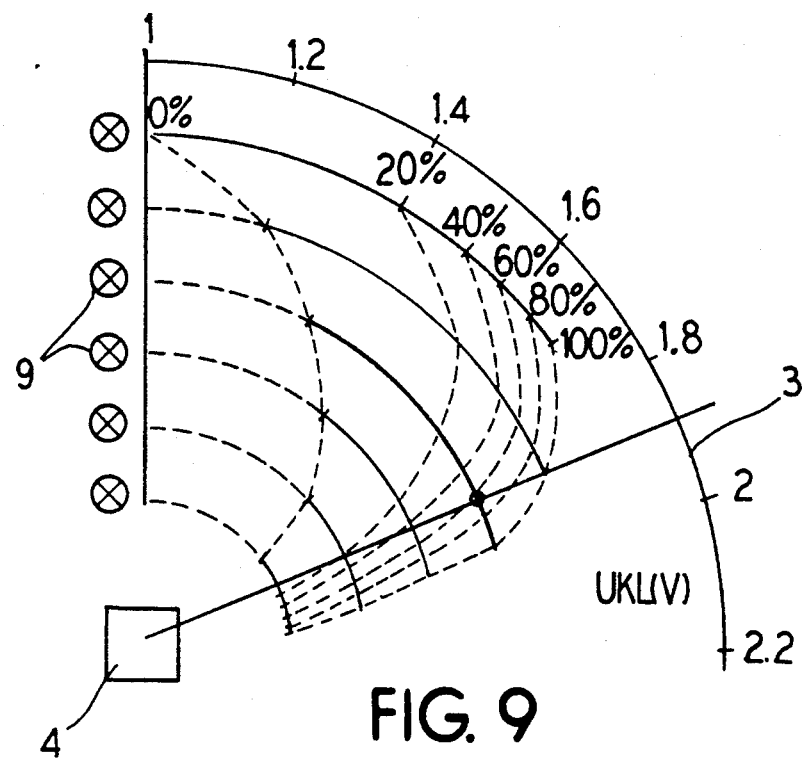
FIG. 9 a schematic illustration of an apparatus for the determination of the energy content value EIW comprising only one voltage-measuring instrument.

In its simplest embodiment, an apparatus for determining the energy content value EIW can be composed of a voltage-measuring instrument 4, particularly of a pointer instrument that, as shown in FIG. 9, is equipped with a scale 3 that is provided with a plurality of ranges 8 that correspond to mutually different sum currents EI or, respectively, corresponding reference values BW/function values FW. The respective sum current EI or, respectively, reference value/function value FW on which the measurement is based can be signalled therein by an optical signal 9.

Figure 10:
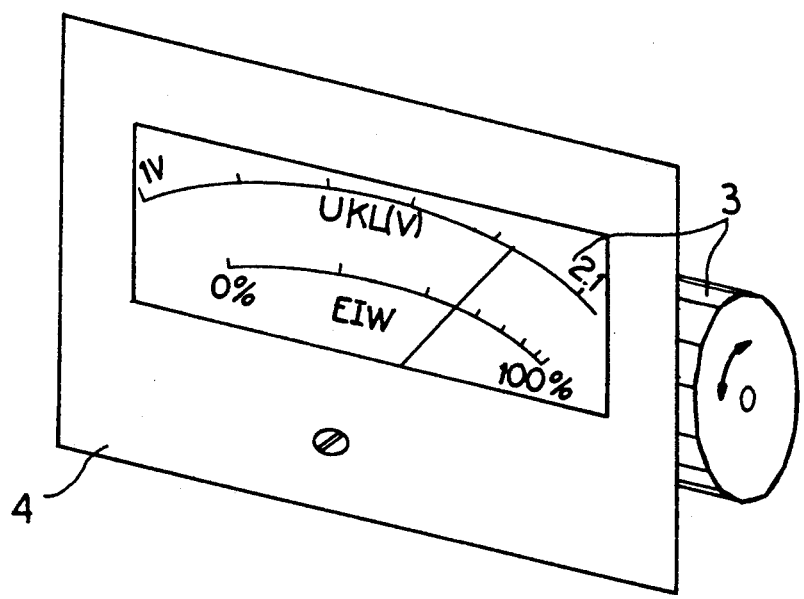
FIG. 10 an illustration of an instrument for an apparatus according to FIG. 8 or 9 comprising a switchable scale.

It can be provided that the individual measuring ranges 8 are preselectable manually, mechanically or in automatically electronic fashion, as shown in FIG. 10.

It has also been envisioned to undertake a determination of the energy content value EIW on the basis of a measurement of the terminal voltage $U_{KL}$ with two instruments 4, as shown in FIG. 8. The optical display according to the embodiment of FIG. 9 is replaced therein with the second pointer unit. The intersection of the two pointers 10 indicates the energy content value EIW on the respectively valid range 8.

Figure 11:
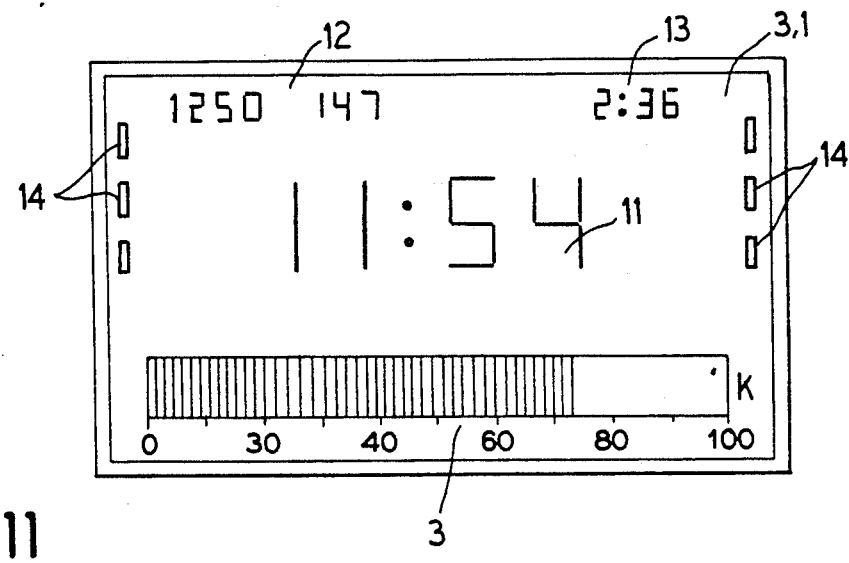
FIG. 11 a view of a measuring device provided, among other things, for displaying the energy content value EIW.

FIG. 11 shows a measuring device for an electric vehicle having an analog display means at a scale 3 calibrated in percent from which the percentage remaining capacity k can be read. The time of day 11 and/or the operating hours 12 and/or the cycle time 13 can also be indicated in this measuring device. Further displays 14 for the cell temperature, the outside temperature, the motor temperature can be provided. Such measuring devices can be useful in electrical vehicles in general, particularly in electrically driven fork lifts. The displays can ensue in digital form. The overall scale 31 at the device side can, in particular be a LCD display module.

Figure 12:
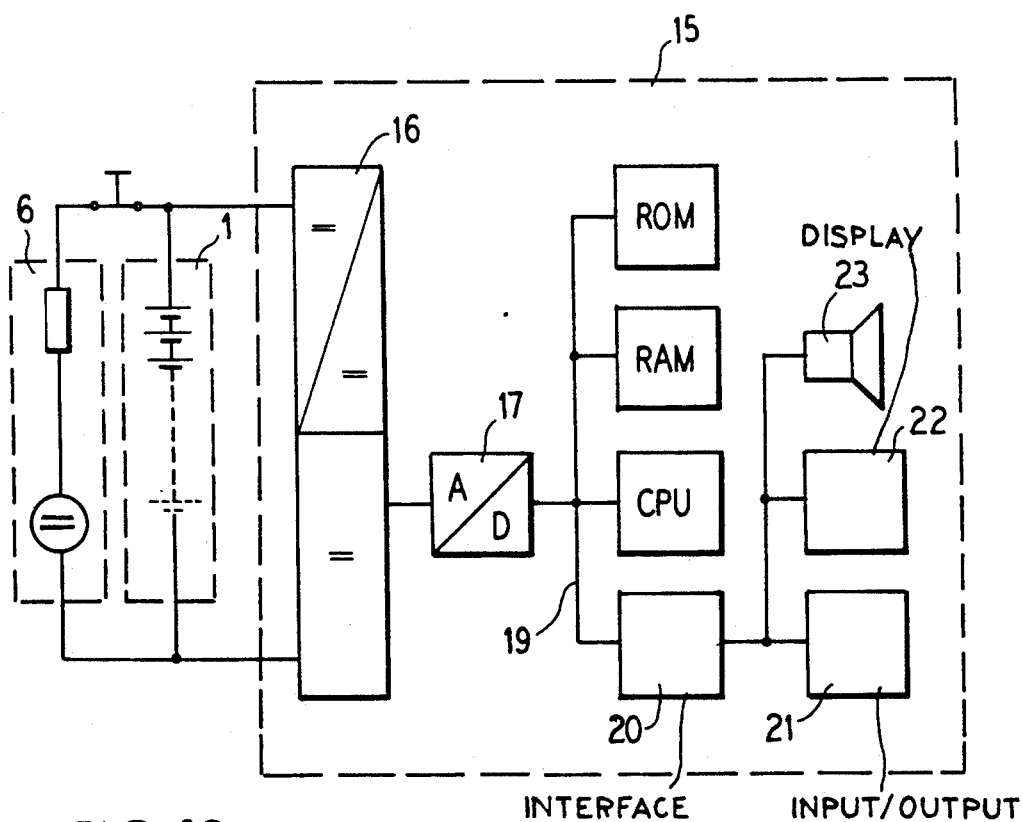
FIG. 12 a block circuit diagram of an apparatus for the determination of the energy content value EIW comprising a computer with semiconductor memory and comprising display, signal and input/output devices being employed at a device operated by an energy store.

FIG. 12 shows a block circuit diagram of an electronic, computer-controlled means for the determination of the energy content value EIW. 11 references an energy store with a load 6 in the circuit. 15 references the electronic part of the means comprising a power supply 16 for supplying the means, comprising an analog-to-digital converter 17 for editing the measured terminal voltage $U_{KL}$ whose information are supplied via a data bus 19 to the central unit CPU that accesses the instrument register having the stored reference values of at least three characteristics 2 in the form of individual reference values EBW when calculating the energy content value EIW. The calculated values are stored in the RAM in percent, in a time unit, in work clocks, in a power unit. Input/output devices 21 such as a keyboard for data input, a magnetic card reader for data input, an opto-electronic reader for data input, a printer for data output, a coordinate plotter for data output are connected via an interface 20. Display means 22 for the direct display of output and/or input values can also be connected to this interface 20. Further, optical and/or acoustic signal generators 23 can also be connected there, these providing a signal particularly given an energy content value of zero in the energy store 1.

The electronic means according to the block circuit diagram of FIG. 12 is not limited to the hardware shown and described there; rather, it can be expanded arbitrarily in accord with the requirements both with respect to the read-only memory ROM as well as with respect to the write-read memory RAM. In particular, thus, it is provided that the individual reference values EBW of the static characteristics 2 from the data sheet of FIG. 3 are deposited in the memory ROM in the form of one or more rectangular matrices and that the columns stored therein correspond to the energy content value EIW, particularly in percentages, and the rows stored therein correspond to the individual reference values EBW of the characteristics 2. It is thereby provided that the individual reference values EBW for the formation of a function value FW can be calculated in an arbitrary plurality for the respective, specific determination of the energy content value EIW.

The present method and the said devices are suitable not only for the determination of the energy content value EIW of electrochemical, chargeable or non-chargeably energy stores but are also suitable for the determination of the energy content value of static energy stores such as represented by capacitors for storing an electrical charge.

The afore-mentioned advantages of the method and of the apparatus cited therein for the implementation of the method, in accord wherewith no operation performed in the load circuit is required, the precision of the result obtained is independent of the load, the age of an energy store, its electrolyte temperature and the degree of charging are expressed in the voltage situation of the measured terminal voltage, wherein the end of discharging differing dependent on the load can be considered and the discharging time still available can be displayed in predicting fashion — given the assumption that the average load will not change significantly after the beginning of the discharge — and wherein the determination of the energy content value EIW becomes more and more precise toward the end of discharging can also be achieved when, in addition to the measurement of the terminal voltage $U_{KL}$, a momentary measurement of the sum current is carried out for the determination of the energy content value EIW upon utilization of the Hall effect, which requires no direct operation performed on the load circuit.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. Method for determining an energy content value of an electrochemical energy store under operating conditions, comprising the steps of:
   connecting the electrochemical energy store to one of a source and load;
   connecting a measuring instrument to the electrochemical energy store;
   sampling a terminal voltage of the electrochemical energy store in a measurement time with the measuring instrument;
   providing a relative remaining capacity of the electrochemical energy store;
   automatically retrieving at least three individual reference values from stored relationship of terminal voltages to sum currents for the provided relative remaining capacity;
   automatically interpolating an assumed sum current from the sum currents that correspond to the at least three individual reference values;
   calculating an absolute capacity by multiplying the assumed sum current by the measurement time;
   using stored characteristics of the energy store to derive a maximum capacity corresponding to the assumed sum current for a maximum obtainable discharge time; and
   calculating a new remaining capacity by subtracting from the initial remaining capacity a ratio of the absolute capacity to the maximum capacity, the new reaming capacity being the energy content value of the energy store;
   displaying the new remaining capacity on the measuring instrument; and
   disconnecting the electochemical energy store from the source or load when the energy content value reachers a predetermined value.

2. The method according to claim 1, wherein the individual reference values are stored in a means for storing in the form of one or more rectangular matrices.

3. The method according to claim 2, wherein a stored row of the matrices corresponds to the individual reference values and stored columns of the matrices correspond to the energy content value, particularly in percentages of the energy content value.

4. The method according to claim 1, wherein the individual reference values are calculated without regard to the respective, specific calculation of the energy content value.

5. The method according to claim 1, wherein the energy content value in an energy content value range is dimensioned as a time-referred value.

6. The method according to claim 1, wherein the energy content value of an energy store is read from a scale of the instrument that measures the terminal voltage of the energy store, whereby a division of an energy content range on the scale is defined by the reference values.

7. The method according to claim 6, wherein the instrument is an electronic, digitally displaying instrument; and wherein ranges of measurement of the terminal voltage by the instrument are at least one of manually switchable or automatically switchable.

* * * * *